United States Patent
Coenen (10) Patent No.: US 7,902,861 B2
(45) Date of Patent: Mar. 8, 2011

(54) ADIABATIC CMOS DESIGN

(75) Inventor: Mart Coenen, Eindhoven (NL)

(73) Assignee: NXP B.V., Eindhoven (NL)

( * ) Notice: Subject to any disclaimer, the term of this patent is extended or adjusted under 35 U.S.C. 154(b) by 297 days.

(21) Appl. No.: 11/719,395

(22) PCT Filed: Nov. 8, 2005

(86) PCT No.: PCT/IB2005/053669
§ 371 (c)(1),
(2), (4) Date: Apr. 14, 2009

(87) PCT Pub. No.: WO2006/051485
PCT Pub. Date: May 18, 2006

(65) Prior Publication Data
US 2010/0060322 A1    Mar. 11, 2010

(30) Foreign Application Priority Data
Nov. 15, 2004  (EP) .................... 04105755

(51) Int. Cl.
*H03K 17/16*    (2006.01)
*H03K 19/003*   (2006.01)

(52) U.S. Cl. ............... 326/33; 326/32; 326/88; 326/103
(58) Field of Classification Search ............... 326/112, 326/119, 121
See application file for complete search history.

(56) References Cited

U.S. PATENT DOCUMENTS

| 5,097,159 A * | 3/1992 | Seki et al. ............... 327/263 |
| 5,726,946 A * | 3/1998 | Yamagata et al. ......... 365/226 |
| 6,097,253 A * | 8/2000 | Hissen .................... 330/277 |
| 2002/0036942 A1 | 3/2002 | Ooishi |
| 2006/0030110 A1* | 2/2006 | Kumura et al. ........... 438/296 |

* cited by examiner

*Primary Examiner* — Anh Q Tran (57) ABSTRACT

An integrated circuit comprising a plurality of CMOS modules (10) connected in series with each other, each module (10) being connected between first and second reference lines (Vdd, Vss). A first transistor (54) is provided between at least one of the modules (10) and the first reference line (Vdd) and a second transistor (52) is provided between one of the modules (10) and the second reference line (Vss) and capacitors (C25, C26) are provided in parallel with the transistors (52, 54) such that they are driven as current sources (I1, I2). As a result power dissipation and leakage current is reduced.

17 Claims, 5 Drawing Sheets

ADIABATIC CMOS DESIGN

This invention relates generally to adiabatic CMOS design and, more particularly to a CMOS circuit design for reducing leakage current and power consumption.

CMOS (Complementary Metal-Oxide Semiconductor) logic uses a combination of p-type and n-type metal-oxide-semiconductor field effect transistors (MOSFETs) to implement logic gates and other digital circuits found in computers, telecommunications and signal processing equipment. The great advantage of CMOS circuits is that they (ideally) allow no current to flow, and thus no power to be consumed, except when the inputs to the logic gates are being switched. CMOS accomplishes this by complementing every n-type MOSFET with a p-type MOSFET and wiring the same input to both in such a way that whenever one is conducting, the other is not.

Over time, MOSFETs are continually being scaled down, firstly because smaller MOSFETs (which have shorter channels) allow more current to pass (per area squared), and secondly because smaller MOSFETs have smaller gates, and thus lower gate capacitance. These two factors contribute to lower switching times, and thus higher processing speeds. Of course, a third reason for the continual drive to scale MOSFETs down in size is that smaller MOSFETs can obviously be packed more densely, resulting in either smaller chips or chips with more computing power in the same area. In any event, the cost of producing integrated circuits is highly related to the number of chips that can be produced per wafer.

Figure 1:
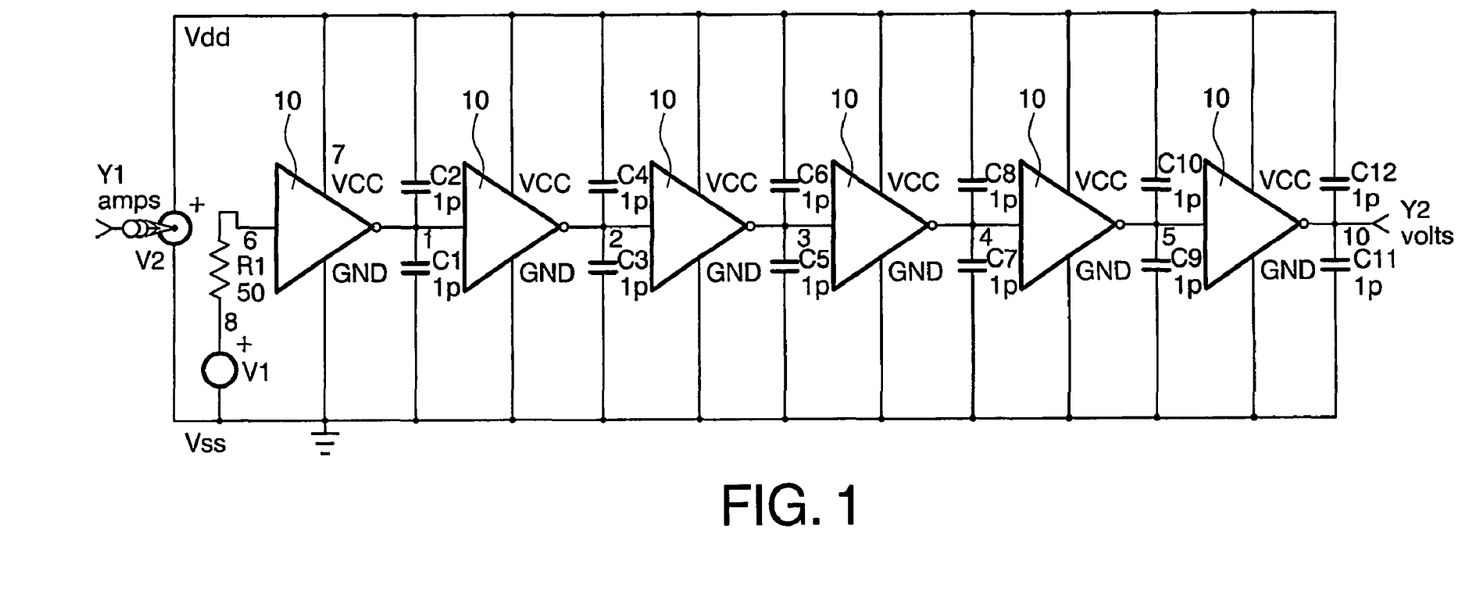
FIG. 1 is a schematic circuit diagram of a CMOS inverter design according to the prior art.
Figure 2:
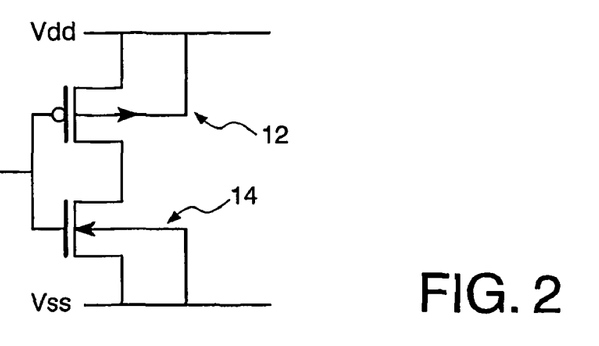
FIG. 2 is a schematic circuit diagram of a CMOS inverter module.

Consider the circuit topology illustrated in FIG. 1. As shown, a plurality of CMOS inverter modules 10 connected in series with each other. Each inverter module 10 comprises a first connection to a supply line $V_{dd}$ and a second connection to ground ($V_{ss}$). For completeness, and referring to FIG. 2 of the drawings, each inverter module comprises a p-channel MOSFET 12 and an n-channel MOSFET 14 connected in series therewith, the gates of the two devices being connected together.

With the growing use of portable and wireless electronic systems, reduction in power consumption has become more and more important in today's VLSI circuit and system designs. For a CMOS circuit, total power consumption during the active mode of operation comprises dynamic power and active leakage power. In standby mode, the power dissipation is due to the standby leakage current and, for example, U.S. Pat. No. 6,307,396 describes a CMOS input buffer stage with an inverter chain, a triple-well transistor and respective capacitors to act as charge stores in case transition of the circuit to low-power standby mode is delayed.

Dynamic power of a CMOS circuit is largely due to the charging and discharging of load capacitances. With each data and/or clock change, the charges, representing the data/clock signals becoming fully charged/discharged, are determined by the chosen reference, Vss or Vdd. The static leakage power of a CMOS circuit is determined by the leakage current through each transistor, which has two main sources: reverse-biased diode junction leakage current, and sub-threshold leakage current. Diode junction leakage is very small and will be ignored hereinafter. Subthreshold leakage current exponentially increases with the reduction of threshold voltage. On the other hand, lowering supply voltage is generally the most effective way to reduce power consumption, but with the scaling of the supply voltage, transistor threshold voltage ($V_t$) should also be scaled in order to satisfy performance requirements as lower supply voltages result in a slower mode of operation. Unfortunately, such scaling leads to the above-mentioned exponential increase in leakage current.

A multiple-threshold CMOS circuit, which has both high and low threshold transistors in a single chip, can be used to deal with the leakage problem, particularly in low voltage low power (LVLP) and high performance applications. The high threshold transistors can suppress the sub-threshold leakage current, while the low threshold transistors are used to achieve the high speed performance (when turned on).

Figure 3:
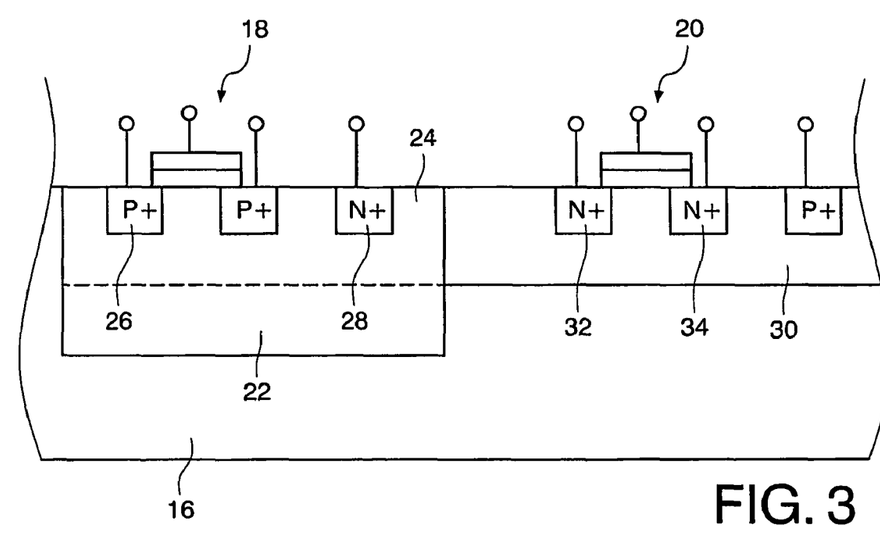
FIG. 3 is a schematic cross-sectional view illustrating triple-well CMOS technology.

It is well known to implement CMOS circuits using triple well CMOS technology in order to reduce noise, especially as device dimensions continue to be scaled down, by enabling additional power switches to be located between the active logic circuit and ground system. These power switches are used to minimize leakage current when the logic circuit is inactive. Referring to FIG. 3 of the drawings, a typical triple well CMOS structure is illustrated schematically, which comprises a p-type substrate 16 for supporting a PMOS transistor 18 and an NMOS transistor 20. The PMOS transistor 18 is comprised of a deep n-type well 22, and a standard n-type well 24 in which the p-type source and drain regions 26, 28 are provided. The NMOS transistor 20 is comprised of a p-type well 30 in which the n-type source and drain regions 32, 34 are provided. Triple well CMOS technology is well known in the art and will not be discussed in any greater detail herein.

In the circuit of FIG. 1, which would typically be realized using triple-well technology, high-$V_t$ (threshold voltage) series transistors are present in the upper (supply) line connection and in the lower (ground) connection respectively of the inverter module immediately prior to the output inverter module, and are used to switch the functional cell voltage on or off, i.e. they are either fully on or fully off, and are therefore not shown.

However, integrated circuit designers, in their attempts to achieve ever smaller transistors and faster switching times, have encountered other difficulties. For example, whereas traditionally switching time was roughly proportional to gate capacitance, MOSFET gate capacitances have decreased to the extent that they are being overwhelmed by other capacitances, most notably interconnect capacitances, that result from the metal wires that connect inputs to outputs.

The interconnect wires in the circuit of FIG. 1 have respective capacitances C1-C12 associated with respective connections to the device bulk and the supply and ground rails, which capacitances are, in standard CMOS design, charged when the p-type MOSFET is open and discharged when the n-type MOSFET is open. In either case, the opposite type MOSFET is in its non-conductive mode. Within designs from 50 nm CMOS onwards, this surrounding interconnect capacitance is dominant far beyond the input capacitances of the gates. In fact, with submicron processes, the interconnect wiring capacitance can be over 80% of the total load capacitance, which results in unsatisfactorily high loss of charges and thus high power consumption.

In the past, various attempts have been made to establish adiabatic CMOS logic designs, and two main concepts in this regard are:
a) changing capacitive charge into current of an inductive element; and
b) transferring charge throughout the data path from input to output by using transfer gate logic.

However, in both cases, the design topology of the CMOS blocks and modules has to be changed significantly, and the resultant losses are generally still too high.

It is an object of the present invention to reduce the loss of charge in a CMOS integrated circuit so as to reduce power consumption and energy losses, and also to reduce leakage currents.

In accordance with the present invention, there is provided a CMOS module connected between a first reference or supply line and a second reference line, a first transistor being present between said module and said first reference line and a second transistor being present between said module and said second reference line, wherein first capacitive means is provided in parallel with said first transistor and second capacitive means is provided in parallel with said second transistor such that, in use, said first and second transistors operate as first and second respective current sources.

As such, all charge put on and taken from the interconnect wiring capacitance can be (re-) collected in the capacitances that are equivalently in series with the supply means. This charge recovery concept applies to all CMOS modules/circuits from standard cells to on-chip and off-chip interfaces (buses) and on-chip and off-chip memory structures when using triple-well technologies.

Also in accordance with the present invention, there is provided a method of fabricating a CMOS module, the method comprising providing a CMOS circuit on a substrate, connecting said CMOS circuit between a first reference or supply line and a second reference line via respective transistors being provided in series with said first and second reference lines, and providing first capacitive means in parallel with said first transistor and second capacitive means in parallel with said second transistor, such that, in use, said first and second transistors operate as first and second respective current sources.

Still further in accordance with the present invention, there is provided an integrated circuit comprising a plurality of CMOS circuits connected in series with each other, said CMOS circuits being connected between a first reference or supply line and second reference line, a first transistor being provided between at least one of said CMOS circuits and said first reference line and a second transistor being provided between at least one of said CMOS circuits and said second reference line, wherein first capacitive means is provided in parallel with said first transistor and second capacitive means is provided in parallel with said second transistor such that, in use, said first and second transistors operate as respective current sources.

Also in accordance with the present invention, there is provided a method of fabricating an integrated circuit, the method comprising forming a plurality of CMOS circuits in a substrate, connecting said CMOS circuits in series with each other and connecting each circuit between a first reference or supply line and a second reference line, providing a first transistor between at least one of said circuits and said first reference line and providing a second transistor between at least one of said circuits and said second reference line, and providing first capacitive means in parallel with said first transistor and providing second capacitive means in parallel with said second transistor such that, in use, said first and second transistors operate as first and second respective current sources.

As a result of the process shrinking in combination with the configuration of the present invention, the interconnect capacitance to the bulk (i.e. supply) becomes dominant over the input capacitances of the loads, which includes the gate capacitances of the CMOS modules.

The first and second capacitive means may comprise, for example, off-chip gate oxide capacitors at the cost of additional contact pads, but more preferably comprise respective trench capacitors, particularly in the case that the integrated circuit is of triple-well CMOS design. A trench capacitor is a capacitor built into a trench etched into the semiconductor substrate. The advantage of this type of capacitor is that it can be relatively easily formed and the area of the capacitor can be expanded (so that larger capacitance values can be achieved) without increasing the area of the wafer required to form the capacitor. The trench capacitances can be embedded underneath the common supply system in metal 1, and less, or even no, gate oxide decoupling capacitance would then be required, which will have a positive impact on yield.

For practical reasons, both trench capacitances are preferably referred towards substrate so as to provide first capacitive means in parallel with the first transition and provide second capacitive means in parallel with the second transistor. As the common supply means can be considered to be of low equivalent series impedance, it is possible to have the second capacitance means in parallel to the second transistor or in parallel to the second transistor referred to the second reference line to substrate with the common supply means in series.

The module beneficially comprises a charge pump for directing charge stored in said first and second capacitive means to a supply means, and preferably vice versa. As a result of this feature, the CMOS design can be made substantially adiabatic, with the losses therein being reduced down to the switching losses of the transistors and the charge pump. The supply means beneficially comprises an equivalent decoupling capacitive means in series therewith through which said charge is directed by said charge pump. The equivalent decoupling capacitive means may comprise one or more relatively large trench capacitors (to obtain a large charge buffer) and (optionally) one or more relatively small gate oxide capacitive means in parallel therewith, although the decoupling capacitor may, alternatively, be provided entirely off-chip.

It will be appreciated that the present invention can be used with CMOS designs, from high power to ultra low power applications, to resolve thermal and battery-related issues. Furthermore, the invention can be used with standard CMOS cell designs as well as interface buses between modules (IP blocks) and even within memory cells.

These and other aspects of the present invention will be apparent from and elucidated with reference to the embodiment described herein.

An embodiment of the present invention will now be described by way of example only and with reference to the accompanying drawings, in which.

Figure 4:
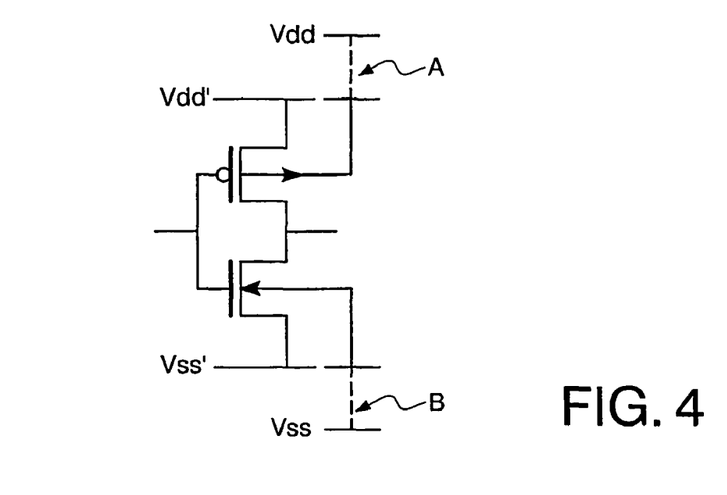
FIG. 4 is a schematic diagram illustrating the concept of multiple-threshold CMOS design.

Referring to FIG. 4 of the drawings, the known concept of variable threshold CMOS is illustrated, whereby the supply voltage to the circuit is variable between an active mode, in which the active logic circuitry is connected to Vdd' and Vss' rails, and a standby mode, in which the circuit is connected to the Vdd and Vss rails. High threshold-voltage (High-Vt) transistors (not shown) are provided (at A and B) in series between the respective supply rails and the CMOS module in order to switch between the two modes and turn the functional cell voltage on or off, and it is an object of this type of arrangement to try an minimize the functional cell voltage in order to minimize the power dissipation, which is achieved by means of the series transistors set in a resistive mode. However, power dissipation is also a function of the charge consumption of the functional cell, and as stated above, it is an object of the present invention to reduce charge loss in a CMOS integrated circuit so as to reduce power consumption and energy losses, and also to, reduce leakage currents.

This object is achieved, in accordance with the invention, by driving the above-mentioned series transistors in a different manner, such that they act as respective current sources (with high equivalent series resistance) by providing capacitors in parallel therewith. The main advantage stems from the fact that the signal interconnect capacitances to the bulk, i.e. supply and surrounding interconnect, becomes dominant over the input capacitances of the loads.

Figure 5:
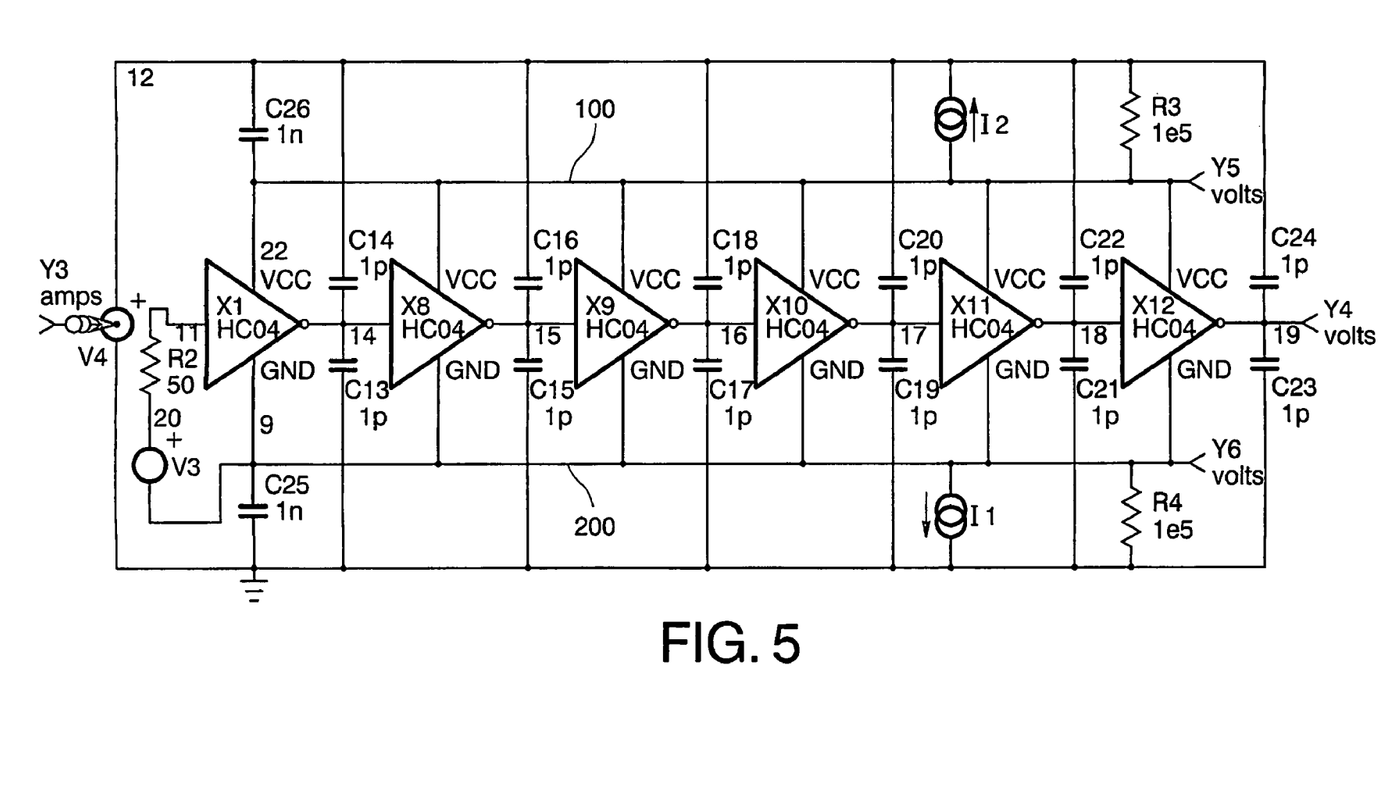
FIG. 5 is a schematic circuit diagram of a CMOS inverter chain according to an exemplary embodiment of the present invention.

Referring to FIG. 5 of the drawings, an integrated circuit according to an exemplary embodiment of the present invention comprises a plurality of CMOS inverter modules 10 connected in series with each other, each module 10 being connected between a supply line and ground, as before. However, in this case, additional transistors are provided in series the supply of the CMOS blocks and modules, both at the supply and at the ground side, which transistors are used as respective current sources I1, I2, rather than as switches or resistors, by providing capacitors C26, C25 in parallel therewith, using triple well process possibilities. In order to ensure that the capacitance of the interconnect wiring remains dominant, it is beneficial to embed two layers 100, 200 of interconnect between the external or common supply and ground layers Vdd, Vss, as shown in FIG. 5. As a result, the voltage across these capacitors can be maintained to a fixed level, e.g. 0.5V or even less. In addition, this back bias voltage level across the capacitors C25, C26 is determined by the lowest stable voltage level one can control with minimum analogue complexity in the CMOS processes currently considered. It is well known that back biasing of transistors with a low threshold voltage reduces leakage currents substantially and when the back-biasing is generated by the circuit itself, the extra capacitance in series with the low-Vt functional circuit will represent such a back-bias voltage. In other words, due to the DC voltage across the (triple-well) capacitances C25, C26, the back-gates of the transistors used in the CMOS blocks and modules are pre-biased such that their leakage becomes significantly less.

As shown, the standard CMOS blocks and modules 10 are in a defined floating configuration between the externally supplied voltage rails. The capacitors C25, C26 together with the current sources I1 and I2 are set to establish equilibrium of voltages across the triple well. The resistors R3 and R4 are included solely to DC bias the circuit to enable analogue circuit simulations to be performed.

Figure 6:
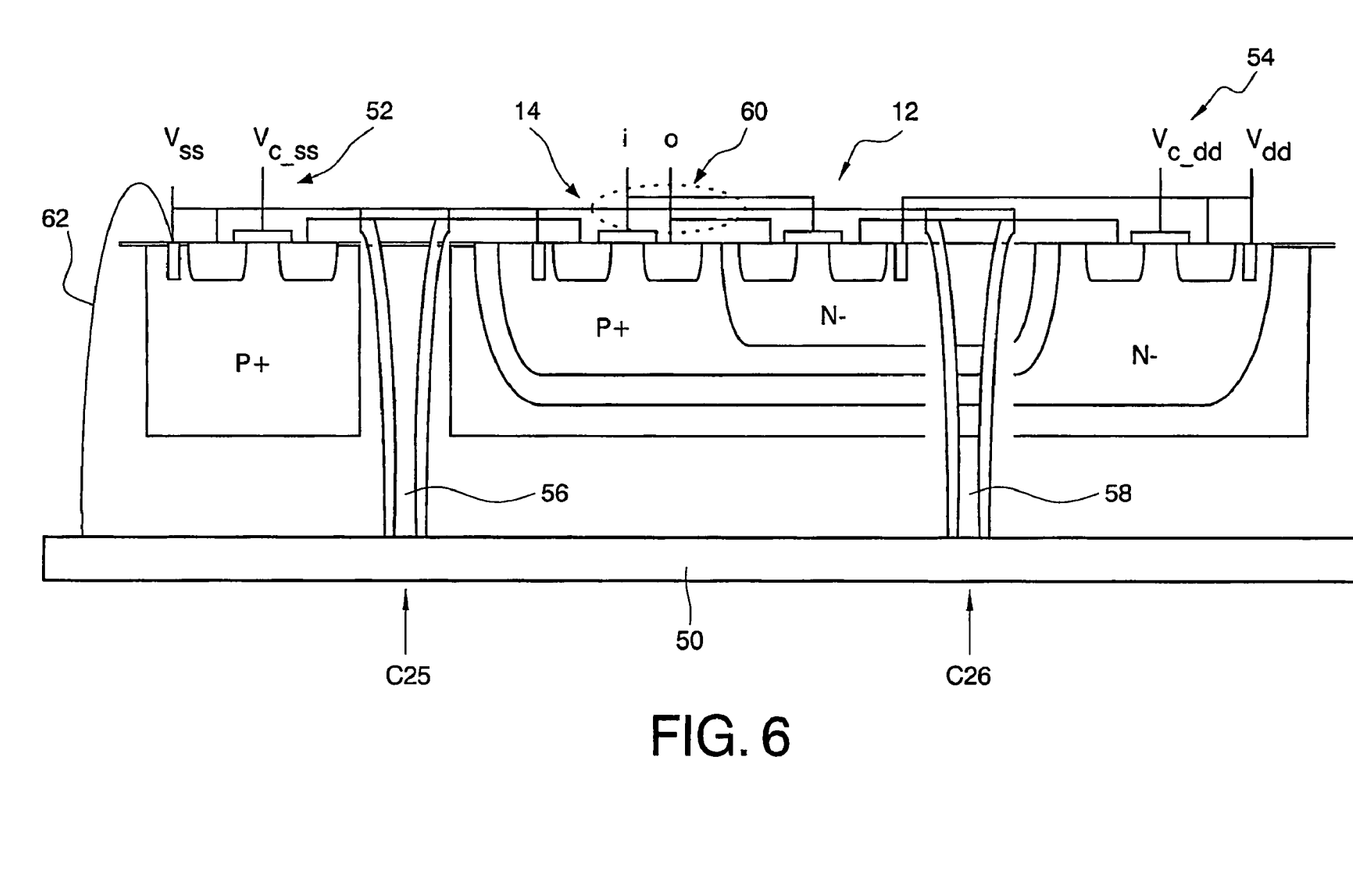
FIG. 6 is a schematic cross-sectional view of a CMOS cell according to an exemplary embodiment of the present invention, formed in triple well and having integrated trench capacitances.

The series capacitances C25, C26 may be provided off-chip, but are more preferably provided on-chip in the form of trench capacitances to ground, because they are relatively easy to manufacture and integrate with the transistors, without unduly increasing the wafer area cost. Referring to FIG. 6 of the drawings, there is illustrated schematically the topology of an adiabatic cell with triple-well and trench capacitances according to an exemplary embodiment of the present invention. As shown, the complementary inverter transistors 12, 14 are realized using triple-well technology on a die pad 50. Similarly, the series transistors 52, 54, which will form the current sources I1 and I2 referred to in respect of FIG. 5, are formed on either side of the complementary MOSFETs 12, 14 at the respective external supply rails Vdd and Vss. Trench capacitances 56, 58 are provided between the complementary MOSFET arrangement and respective transistors 52, 54, and the capacitances are wired to Vss and/or Vdd as shown at 60. A down bond 62 from Vss to the die pad 50 is also shown. By means of the down bond to the die-pad, which is connected to the back-side of the substrate, contacts to the trench capacitors, the series resistivity (i.e. losses within the trench capacitances) can be further reduced.

Figure 7:
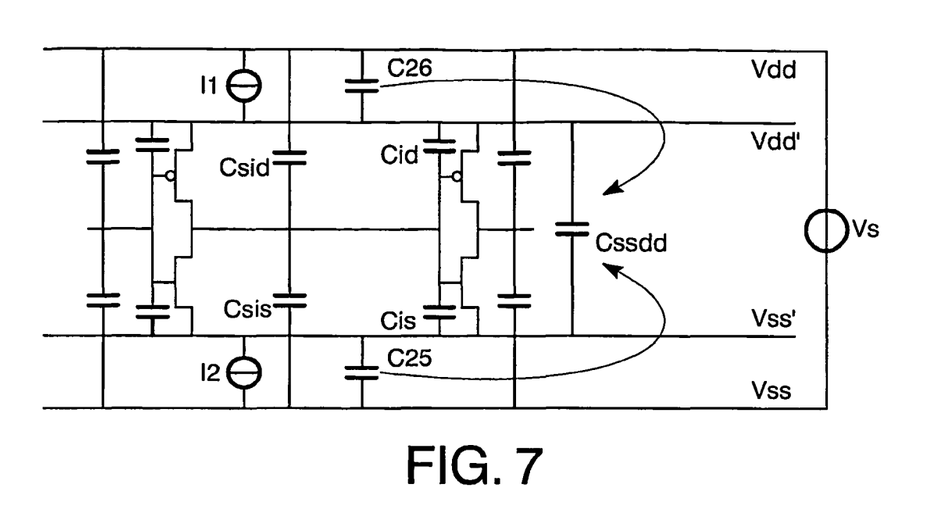
FIGS. 7 and 8 are schematic circuit diagrams illustrating the flow of charge in a CMOS module according to an exemplary embodiment of the present invention.
Figure 8:
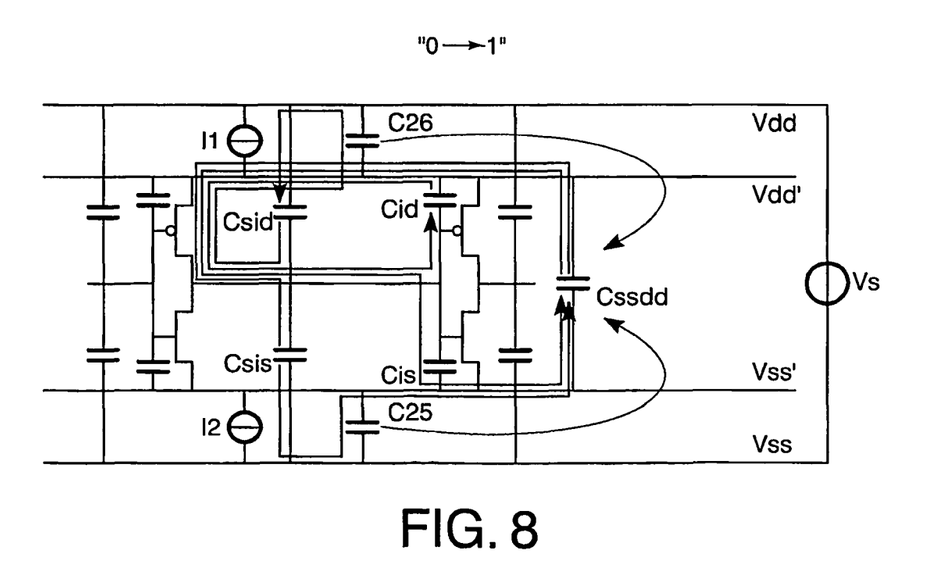

Referring to FIGS. 7 and 8 of the drawings, all of the interconnect capacitances Csid and Csis (represented by capacitors C13 to C24 in FIG. 5) can now be charged and discharged from the top supply rail via the triple well capacitances C26 and C25. In other words, as a result of switching, the interconnect capacitances Csid, Csis will dump their charge into C26 and C25. As these triple-well capacitances are considered large in comparison with the interconnect capacitances, all charge, excluding the charge that will be dissipated due to the switching of the low-Vt output transistors within the CMOS modules, can be recovered. This will cause the voltage across C26 and C25 to increase, the voltage across an internal node or supply decoupling capacitance Cssdd will reduce to a level where the circuits become inoperative. By transferring the charge from capacitors C26 and C25 to Cssdd, the charge balance is restored (apart from any small losses caused by the resistivity of the output transistors during transition from a conductive to a non-conductive state), i.e. the (otherwise) lost charge is provided from the outer supply nodes to the inner supply nodes by the current sources I1 and I2.

With the exemplary practical implementation of the invention shown in FIG. 6, the charge intended to be present in the capacitance Cssdd is found as the voltage difference between C25 and C26 respectively. The three capacitance (Cssdd, C25 and C26) option given in FIGS. 7 and 8 can be reduced to the two capacitance (C25 and C26) option as given in FIG. 6, thereby resulting in less area (≈50%) for the capacitances required for implementation of the present invention.

In a preferred embodiment, a charge pump is used to port the charge to the supply decoupling capacitance Cssdd (or its equivalent). This capacitance has to be large enough to allow a large time constant for the charge recovery process. The charge transfer capacitance used with the charge pump (not shown in FIG. 5) will be small compared to the equivalent supply decoupling capacitance. It will be appreciated that the ratio between the interconnect wiring capacitance and the other supply buffering capacitors has to be large so as to ensure that the voltage variation across the supply buffering capacitances is low such that the threshold voltage of the standard CMOS cells is not unduly affected, i.e. unduly modulating the leakage current. However, although this implementation requires substantial capacitance Cssdd, this particular capacitance may be established by a parallel circuitry of trench capacitances (to obtain a large charge buffer) and smaller gate oxide capacitors that will ensure the local charge from (clock) cycle-to-cycle. As will be known to a person skilled in the art, trench capacitance can be achieved at >100 $nF/mm^2$, whereas gate oxide capacitance can be created at <10 $nF/mm^2$. Additionally, gate oxide capacitance has an equivalent low series resistance, whereas trench capacitance has a substantially larger equivalent series resistance, acting as a ladder RC-network. As such, the RC-product of each can be brought in line with each other.

In order to reduce the complexity of the charge pumps, these could be applied externally at the cost of additional power pins to the core blocks. However, the proposed topology can be used on-chip for each and every block or module, requiring a larger amount of small charge pumps. The interfaces between such blocks and modules may require level shifters to compensate for differences in threshold voltages of the low-Vt transistors (which will be affected by the triple-well voltage).

An on-chip power manager (not shown) knows in advance when cells or blocks of cells have to become active. Then the charge pump(s), or the current sources in parallel with the series capacitances, can be used two-fold. When ramping the supply voltage up, the charge from the top supply Vdd will be fed slowly into the capacitances (C25, C26 (and Cssdd, when used)) and this provides the inner supply voltage Vdd' to these cells. When ramping down, the charge pumps can unload the charge for as long as possible to retrieve the charge from the series capacitances C25, C26. In other words, with the described topology, the power on and off modes of the blocks and modules can be easily achieved as all the charge can be transferred from one level to another and, although this can take a little time, this time can be aligned with the external supply system that will have a step recovery time of several µs anyway.

In summary, loss of charge in CMOS applications can be at least significantly reduced using the present invention, by recovering such charge into another on- or off-chip capacitance. With the use of triple well technology, together with on-chip capacitance, e.g. by using trench capacitances, a charge recovery can be achieved which reduces losses down to the switching losses of the transistors and the charge pump. This technique can be used with all CMOS processes where triple well technology occurs and is not restricted to 20 nm CMOS technology but can be used beyond in 90 nm CMOS technology and further. The main advantage stems from the fact that the signal interconnect (i.e. wiring) capacitance to the bulk, i.e. supply and surrounding interconnect, becomes dominant over the input capacitances of the loads. Furthermore, the application reduces the leakage current substantially due to the back-biasing and the supply-enabling of the blocks and modules can be fully controlled which reduces dI/dt losses on the internal voltages accordingly.

Advantages:

The proposed CMOS circuit topology will reduce the power dissipation substantially down to the level of becoming close to adiabatic. For example, with regard to the inverter chain illustrated, the current can be reduced from 50 mA to less than 2 mA, while obtaining the same functional performance.

The proposed new CMOS circuit topology can reduce leakage of the blocks substantially due to the back-gate biasing of the switching transistors.

The standard design topology of the CMOS blocks and modules can be maintained (which is not the case when using transfer gate logic or topologies where inductances are used to recover the energy).

Due to the use of large storage capacitors, the time constant of the process can be reduced which enables the use of charge pumps. The overall loss of the circuit is determined by losses in the output transistors and charge pumps.

When using isolated trench capacitors with internal charge storage, the stray capacitance to substrate is obtained additionally (for free). In parallel to these trench capacitances, gate oxide capacitors can be used to deliver the cycle-to-cycle charge required. As the trench capacitances act as RC-ladder networks the capacitance used in the contacting area may already be enough to replace the gate-oxide capacitances without degrading the time-constant required for its operation.

It should be noted that the above-mentioned embodiments illustrate rather than limit the invention, and that those skilled in the art will be capable of designing many alternative embodiments without departing from the scope of the invention as defined by the appended claims. In the claims, any reference signs placed in parentheses shall not be construed as limiting the claims. The word "comprising" and "comprises", and the like, does not exclude the presence of elements or steps other than those listed in any claim or the specification as a whole. The singular reference of an element does not exclude the plural reference of such elements and vice-versa. The invention may be implemented by means of hardware comprising several distinct elements, and by means of a suitably programmed computer. In a device claim enumerating several means, several of these means may be embodied by one and the same item of hardware. The mere fact that certain measures are recited in mutually different dependent claims does not indicate that a combination of these measures cannot be used to advantage.

The invention claimed is:

1. An adiabatic circuit comprising:
a first reference line;
a second reference line;
a CMOS module connected between the first reference line and the second reference line,
a first transistor connected between the CMOS module and the first reference line;
a second transistor connected between the CMOS module and the second reference line;
a first capacitive circuit connected in parallel with the first transistor, and
a second capacitive circuit connected in parallel with the second transistor, wherein the first and second transistors are configured and arranged to operate as first and second respective current sources that are configured to establish a fixed voltage across the respective first and second capacitive circuits.

2. An adiabatic circuit according to claim 1, wherein said first and second capacitive circuits comprise respective trench capacitors.

3. An adiabatic circuit according to claim 1, wherein said first and second capacitive circuits comprise off-chip capacitors.

4. An adiabatic circuit according to claim 1, further comprising a charge pump for directing charge stored in said first and second capacitive circuits to a supply.

5. An adiabatic circuit according to claim 4, wherein said charge pump is arranged and configured to direct charge from said supply to said first and second capacitive circuits.

6. A method of fabricating a CMOS module, the method comprising:
providing a CMOS circuit on a substrate,
connecting said CMOS circuit between a first reference line and a second reference line via respective first and second transistors being provided in series with said first and second reference lines, and
providing first capacitive circuit in parallel with said first transistor and second capacitive circuit in parallel with said second transistor wherein said first and second transistors operate as first and second respective current sources that are configured to establish a fixed voltage across the respective first and second capacitive circuits.

7. An integrated circuit comprising
a first reference line;
a second reference line;
a plurality of CMOS circuits connected in series with each other, said CMOS circuits being connected between the first reference line and the second reference line;
a first transistor connected between at least one of said CMOS circuits and said first reference line;
a second transistor connected between at least one of said CMOS circuits and said second reference line;
a first capacitive circuit connected in parallel with said first transistor; and
a second capacitive circuit connected in parallel with said second transistor,
wherein said first and second transistors are configured and arranged to operate as respective current sources that are configured to establish a fixed voltage across the respective first and second capacitive circuits.

8. An integrated circuit according to claim 7, comprising a supply and a charge pump for directing charge stored in said first and second capacitive circuits to said supply.

9. An integrated circuit according to claim 8, comprising a decoupling capacitive circuit in series with said supply through which said charge is directed by said charge pump.

10. An integrated circuit according to claim 9, wherein said decoupling capacitive circuit comprises one or more relatively large trench capacitors.

11. A method of fabricating an integrated circuit, the method comprising:
forming a plurality of CMOS circuits in a substrate,
connecting said CMOS circuits in series with each other,
connecting each CMOS circuit between a first reference line and a second reference line,
providing a first transistor between at least one of said CMOS circuits and said first reference line,
providing a second transistor between at least one of said CMOS circuits and said second reference line,
providing a first capacitive circuit in parallel with said first transistor and
providing a second capacitive circuit in parallel with said second transistor wherein said first and second transistors operate as first and second respective current sources that are configured to establish a fixed voltage across the respective first and second capacitive circuits.

12. The method of claim 11, wherein the first transistor operates as a current source that directs current in a direction from the CMOS circuits to the first reference line and wherein the second transistor operates as a current source that directs current in a direction from the CMOS circuits to the second reference line.

13. The circuit of claim 1, wherein the first transistor operates as a current source that generates a current from the CMOS module to the first reference line, and wherein the second transistor operates as a current source that generates a current from the CMOS module to the second reference line.

14. The circuit of claim 1, wherein the first transistor operates as a current source that generates a back bias voltage level across the first capacitive circuit and wherein the second transistor operates as a current source that generates a back bias voltage level across the second capacitive circuit.

15. The method of claim 11, wherein the first transistor operates as a current source that generates a back bias voltage level across the first capacitive circuit and wherein the second transistor operates as a current source that generates a back bias voltage level across the second capacitive circuit.

16. The method of claim 6, wherein the first and second transistors are configured and arranged to operate as current sources that create a back bias voltage level across the first capacitive circuit and the second capacitive circuit.

17. The circuit of claim 7, wherein the first and second transistors are configured and arranged to generate a back bias voltage level across the first capacitive circuit and the second capacitive circuit.

* * * * *